United States Patent
Lee

(10) Patent No.: US 8,373,344 B2
(45) Date of Patent: Feb. 12, 2013

(54) ORGANIC ELECTRO-LUMINESCENCE DISPLAY DEVICE AND METHOD FOR FABRICATING THE SAME

(75) Inventor: Jae-Hyuk Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 118 days.

(21) Appl. No.: 12/591,261

(22) Filed: Nov. 13, 2009

(65) Prior Publication Data

US 2010/0308720 A1    Dec. 9, 2010

(30) Foreign Application Priority Data

Jun. 3, 2009  (KR) ........................ 10-2009-0049245

(51) Int. Cl.
*H05B 33/04* (2006.01)
*H05B 33/00* (2006.01)
*H01L 51/00* (2006.01)
*H01L 51/52* (2006.01)

(52) U.S. Cl. .................. 313/512; 313/498; 313/506

(58) Field of Classification Search ........... 313/498–512
See application file for complete search history.

(56) References Cited

U.S. PATENT DOCUMENTS

| | | | |
|---|---|---|---|
| 2003/0218422 A1* | 11/2003 | Park et al. ...................... | 313/512 |
| 2004/0027066 A1 | 2/2004 | Park et al. | |
| 2005/0122042 A1* | 6/2005 | Kang et al. ..................... | 313/506 |
| 2007/0194304 A1* | 8/2007 | Zu et al. .......................... | 257/40 |
| 2008/0224601 A1* | 9/2008 | Frischknecht ................ | 313/504 |

FOREIGN PATENT DOCUMENTS

JP    2004-227792    8/2004

* cited by examiner

*Primary Examiner* — Anh Mai
*Assistant Examiner* — Zachary J Snyder
(74) *Attorney, Agent, or Firm* — McKenna Long & Aldridge LLP

(57) ABSTRACT

The embodiments of the present invention relate to an organic electro-luminescence display device and a method for fabricating the same, which can improve reliability and reduce production cost. The organic electro-luminescence EL display device has a thin film transistor array unit formed on a lower substrate, an organic EL array unit on the thin film transistor array unit having a matrix of organic EL cells, and a glass cap bonded to the lower substrate with sealant at edges of the lower substrate for protecting the organic EL array unit, wherein the glass cap includes a vertical portion bonded to the lower substrate with the sealant, a horizontal portion connected to the vertical portion to face the organic EL array unit including a first region and a second region having rectangular flat recesses each with a thickness thinner than the first region, and moisture absorbent within each of the recesses.

11 Claims, 10 Drawing Sheets

ORGANIC ELECTRO-LUMINESCENCE DISPLAY DEVICE AND METHOD FOR FABRICATING THE SAME

CROSS REFERENCE TO RELATED APPLICATION

This application claims the benefit of the Korean Patent Application No. 10-2009-49245, filed on Jun. 3, 2009, which is hereby incorporated by reference as if fully set forth herein.

BACKGROUND OF THE DISCLOSURE

1. Field of the Disclosure

The present invention relates to organic electro-luminescence display devices, and, more particularly, to an organic electro-luminescence display device and a method for fabricating the same, which can improve reliability and reduce production cost.

2. Discussion of the Related Art

Recently, various kinds of flat display devices are under development for reducing weight and volume which is a disadvantage of cathode ray tubes. In the flat display devices, there are liquid crystal display devices LCD, field emission display devices FED, plasma display panels PDP, electro-luminescence display devices by using organic electro-luminescence display devices (organic EL display device), and so on. Active research for improving display quality and fabricating large screen sizes is ongoing.

Of the flat display devices, the organic EL display device, a spontaneous emission device, has advantages of fast response speed, high emission efficiency and luminance, and large viewing angle. The organic EL display device is provided with a thin film transistor array unit formed on a transparent substrate, an organic EL array unit on the thin film transistor array unit, and a glass cap for isolating the organic array unit from the external environment.

The thin film transistor array unit has gate lines, data lines, and driving units for driving organic EL cells, such as cell driving units.

The organic EL array unit has a matrix of organic EL cells connected to driving thin film transistors in the thin film transistor array unit.

The organic cells in the organic EL array unit are susceptible to degradation from moisture and oxygen. In order to solve such problems, an encapsulation step is performed, in which the substrate having the organic EL array unit formed thereon is bonded to the glass cap with sealant. The glass cap disperses heat generated at the time of light emission and protects the organic EL array from external forces, oxygen, and moisture in the air.

The glass cap has moisture absorbent attached to a surface facing the organic EL array unit. The moisture absorbent serves to absorb moisture and oxygen from the organic EL array unit packaged by the glass cap. The moisture absorbent is also called a getter.

However, as the organic EL display device becomes larger gradually, in cases the glass cap sags or a portion having the moisture absorbent attached thereto are pressed down by an external pressure, scratches are formed on the organic EL cells due to the moisture absorbent to cause a image defects, such as dark spots. As a result of this, reliability of the organic EL array unit is impaired.

SUMMARY OF THE DISCLOSURE

Accordingly, the present invention is directed to an organic electro-luminescence display device and a method for fabricating the same.

An object of the present invention is to provide an organic electro-luminescence display device and a method for fabricating the same, which can improve reliability and reduce production cost.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electro-luminescence EL display device having a thin film transistor array unit formed on a lower substrate, an organic EL array unit on the thin film transistor array unit having a matrix of organic EL cells, and a glass cap bonded to the lower substrate with sealant at edges of the lower substrate for protecting the organic EL array unit, wherein the glass cap includes a vertical portion bonded to the lower substrate with the sealant, a horizontal portion connected to the vertical portion to face the organic EL array unit including a first region, and a second region having rectangular flat recesses each with a thickness thinner than the first region, and moisture absorbent within each of the recesses.

The recesses are formed in a surface facing the organic EL array unit adjacent to the edges of the horizontal portion.

The device may further include a plastic film applied to the first region. The plastic film may be applied to the first region with a two-sided tape disposed therebetween. The plastic film is formed of one selected from PET (Polyethylene Terephthalate), PEN (Polyethylene Naphthalate), PC (Polycarbonate), PES (Polyethersulfone), PAR (Polyarylate), PCO (Photocatalytic oxidation) and PI (Polyamide).

In the meantime, the first region has a difference of thickness from the second region, greater than a thickness of the moisture absorbent.

Or, depending on cases, the recesses may be formed in a surface facing the organic EL array unit throughout the horizontal portion at fixed intervals. In this case, the first region that defines the recesses therein is formed in a planar grating shape on the horizontal portion. The device may further include a plastic film placed on the first region of the horizontal region having the recesses. In this case, the plastic film includes holes formed in portions of the plastic film over the moisture absorbent. The plastic film is applied to the first region with a two-sided tape disposed therebetween.

In the meantime, the device may further include an inside space protected by the glass cap having a pressure higher than the atmospheric pressure.

In another aspect of the present invention, a method for fabricating an organic electro-luminescence EL display device includes the steps of forming a thin film transistor array unit and an organic EL array unit on a lower substrate succession, forming a glass cap for protecting the organic EL array unit, and bonding the glass cap to the lower substrate with sealant at edges of the lower substrate, wherein the step of forming a glass cap comprises the steps of forming a vertical portion bonded to the lower substrate with the sealant, and a horizontal portion connected to the vertical portion to face the organic EL array unit including a first region, and a second region having rectangular flat recesses each with a thickness thinner than the first region, and placing the moisture absorbent within each of the recesses.

The step of forming a vertical portion and a horizontal portion may include the steps of providing a glass sheet, patterning the glass sheet by photolithography and etching with a first mask to form the vertical portion and the horizontal portion in the vertical portion, and forming the recesses in the horizontal portion by photolithography and etching with a second mask.

Or, alternatively, the step of forming a vertical portion and a horizontal portion includes the steps of providing a glass sheet, and patterning the glass sheet by photolithography and etching with a half-tone mask to form the vertical portion and the horizontal portion in the vertical portion having the recesses.

The step of forming the vertical portion and the horizontal portion having the recesses further includes the step of forming a passage between the vertical portion and the recesses extended from the rectangular recesses toward the vertical portion.

At the time the recesses are defined on an outside of the horizontal portion, a plastic film may be applied to the first region which is a central portion of the horizontal portion with a two-sided tape disposed therebetween. In this instance, the method may further include the step of forming a metal wiring on a sidewall of the first region and the plastic film.

Or, at the time the recesses are formed throughout an entire surface of the horizontal portion, the first region that defines the recesses therein is formed in a planar grating shape on the horizontal portion. In this instance, the method may further include the step of applying a plastic film having holes in portions thereof over the moisture absorbent to an upper side of the first region in the horizontal portion having the recesses. The plastic film is applied to the first region with a two-sided tape disposed therebetween.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
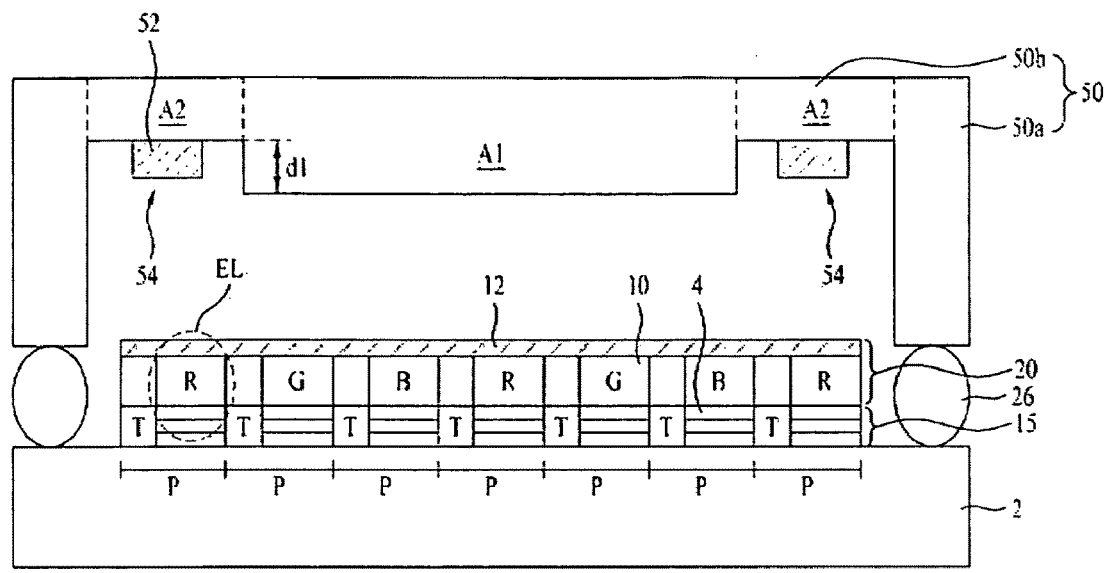
FIG. 1 illustrates a section of an organic EL display device in accordance with a first preferred embodiment of the present invention.

FIG. 1 illustrates a section of an organic EL display device in accordance with a first preferred embodiment of the present invention.

Referring to FIG. 1, the organic EL display device includes a thin film transistor array unit 15 formed on a lower substrate 2, an organic EL array unit 20 on the thin film transistor array unit 15, and a glass cap 50 for isolating the organic EL array unit 20 from an external environment.

Figure 2:
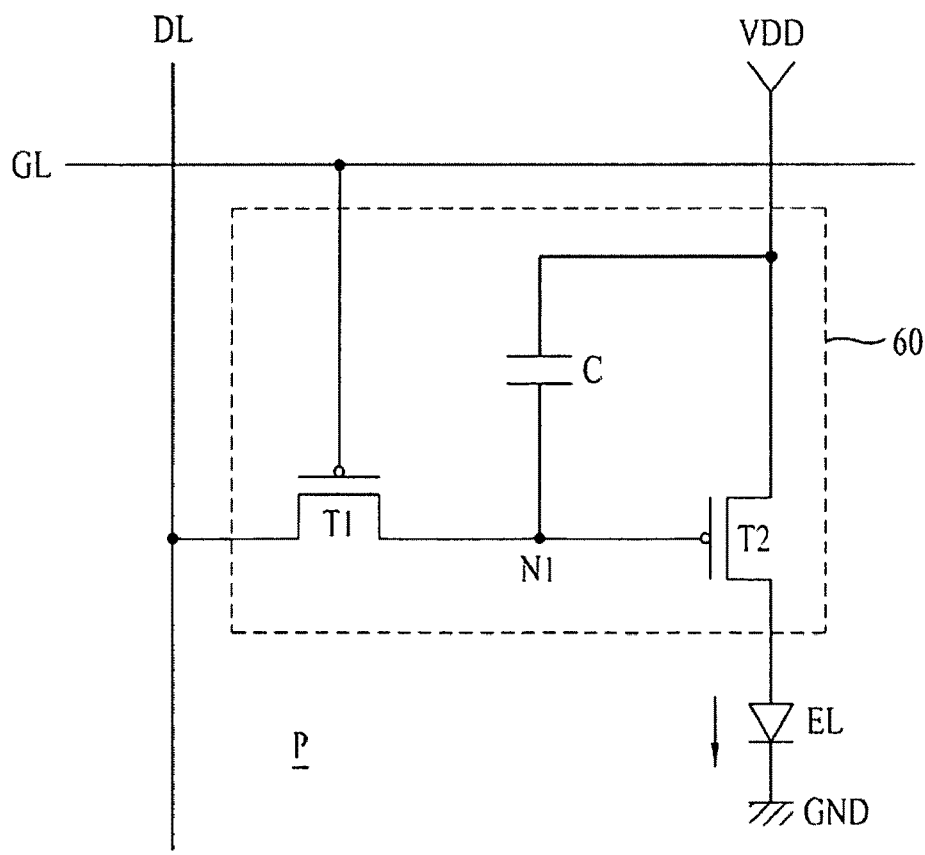
FIG. 2 illustrates a circuit diagram of the thin film transistor array unit in FIG. 1.

The thin film transistor array unit 15 has a circuit as shown in FIG. 2. Referring to FIG. 2, the thin film transistor array unit 15 has a matrix of pixels P formed at every region defined as gate lines GL and data lines DL cross. The pixel P emits a light pertinent to a data signal upon reception of the data signal from the data line DL when a gate pulse is supplied to the gate line GL.

For this, the pixel P includes an organic EL cell EL having a cathode connected to a base voltage source GND, and a cell driving unit 60 connected to the gate line GL, the data line DL, a supply voltage source VDD, and an anode of the organic EL cell EL for driving the organic EL cell EL. The cell driving unit 60 includes a switching thin film transistor T1, a driving thin film transistor T2, and a capacitor C.

The switching thin film transistor T1 is turned on when a scan pulse is supplied to the gate line GL to supply the data signal from the data line DL to a first node N1. The data signal supplied to the first node N1 thus charges the capacitor C and is supplied to a gate terminal of the driving thin film transistor T2. The driving thin film transistor T2 controls an intensity of a current I being supplied from the supply voltage source VDD the organic EL cell EL in response to the data signal supplied to the gate terminal, for controlling a quantity of light emission from the organic EL cell EL. Since the data signal is discharged from the capacitor C even if the switching thin film transistor T1 is turned off, the driving thin film transistor T2 sustains the light emission from the organic EL cell EL by supplying the current I from the supply voltage source VDD to the organic EL cell EL until the next frame data signal is supplied.

The organic EL array unit 20 has a matrix of the organic EL cells EL each with an organic EL layer 10, and an anode 4 and a cathode 12 with the organic EL layer 10 disposed therebetween. The organic EL cell EL, driven by the thin film transistor array unit 15, emits the light toward the glass cap 50 or the lower substrate 2. In a case of an upper side light emission organic EL display device that produces an image by emitting the light toward a glass cap 50 direction, a reflective plate may be positioned between the organic EL cells EL and the thin film transistor array unit 20.

Since the glass cap 50 has a plurality of moisture absorbents 52 attached to a surface facing the organic EL array unit 20, the glass cap 50 serves to absorb moisture and oxygen from the organic EL array unit. The moisture absorbent 52 is also called as getter agent, and may be formed of, for an example, calcium oxide CaO.

The glass cap 50 will be described in more detail with reference to FIGS. 1 and 3.

Figure 3:
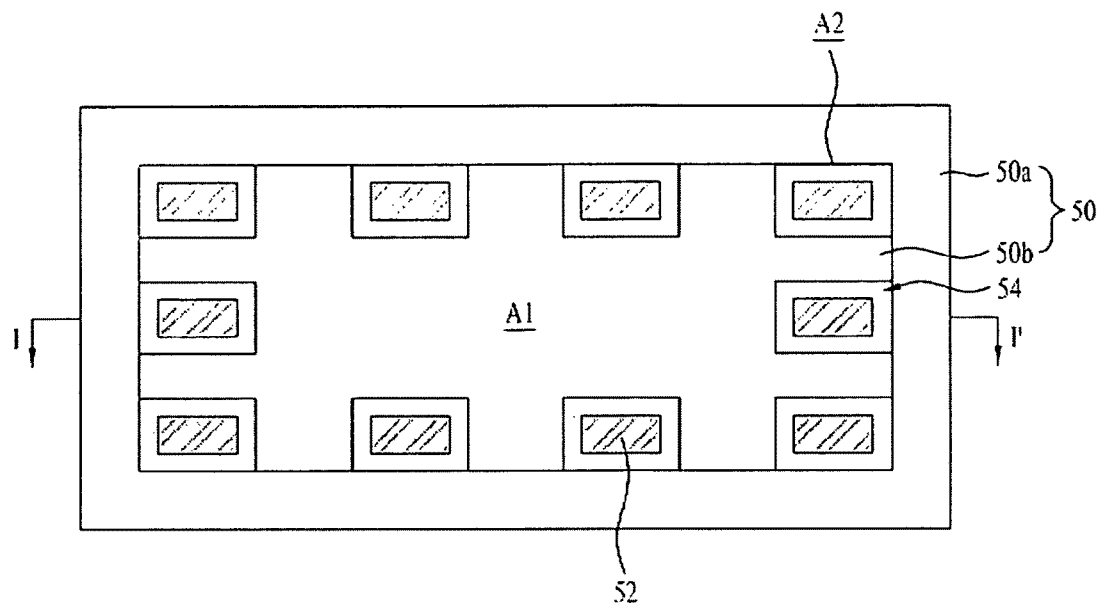
FIG. 3 illustrates a plan view of an inside structure of a glass cap in accordance with a first preferred embodiment of the present invention.

FIG. 3 illustrates a plan view of an inside structure of a glass cap in accordance with a first preferred embodiment of the present invention.

Referring to FIGS. 1 and 3, the glass cap 50 includes a vertical portion 50a bonded to the lower substrate 2 with sealant 26, and a horizontal portion 50b, which has recesses 54, perpendicular to the vertical portion 50a having a surface facing the organic EL array unit 20.

The horizontal portion 50b includes a first region A1 which is a central region of the horizontal portion 50b having a thickness thicker than other regions, and a second region A2 on an outer side of the first region A1 overlapped with rectangular recesses 54 having a thickness thinner than the first region A1. That is, the second region A2 is overlapped with the recesses 54, but not with the first region A1.

The moisture absorbent 52 is positioned only in the rectangular recesses 54, but not at the region overlapped with the first region A1. The moisture absorbent 52 has a height smaller than a step d1 between the first region A1 and the second region A2, i.e., a difference of thicknesses of the first region A1 and the second region A2. Accordingly, since the moisture absorbent 52 is surrounded by the recess 54, the moisture absorbent 52 can not be brought into contact with to the organic EL cell even if the glass cap 50 sags or is pressed down by an external pressure. As a result of this, formation of a defective image, such as dark spots, caused by scratches is prevented, thereby improving reliability of the organic EL display device.

A method for fabricating the organic EL display device in accordance with the first preferred embodiment of the present invention will be described with reference to FIGS. 4a to 4d.

Figure 4A:
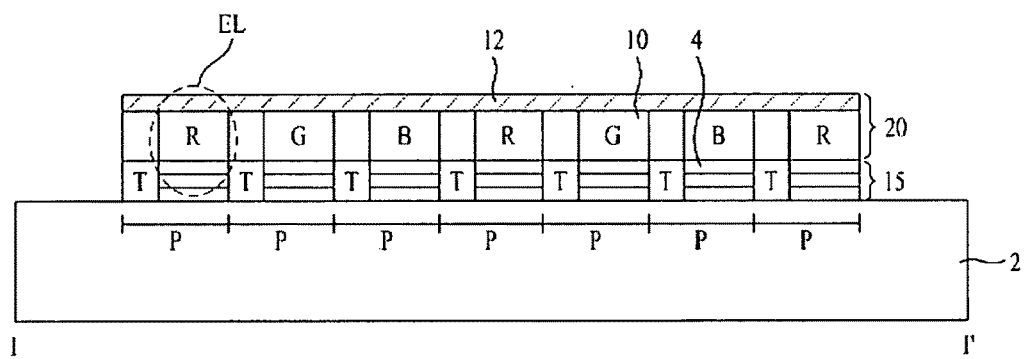
FIGS. 4a to 4d illustrate sections showing the steps of a method for fabricating the organic EL display device.

Referring to FIG. 4a, a thin film transistor array unit 15 and an organic EL array unit 20 are formed on a lower substrate 2 in succession. The thin film transistor array unit 15 includes gate lines GL and data lines DL, switching transistors T1, driving transistors T2 and capacitors C.

Figure 4B:
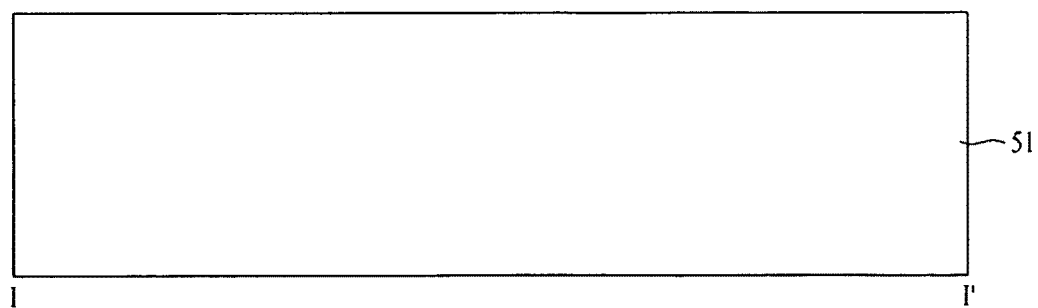

Then, a glass sheet 51 as shown in FIG. 4b is provided.

Figure 4C:
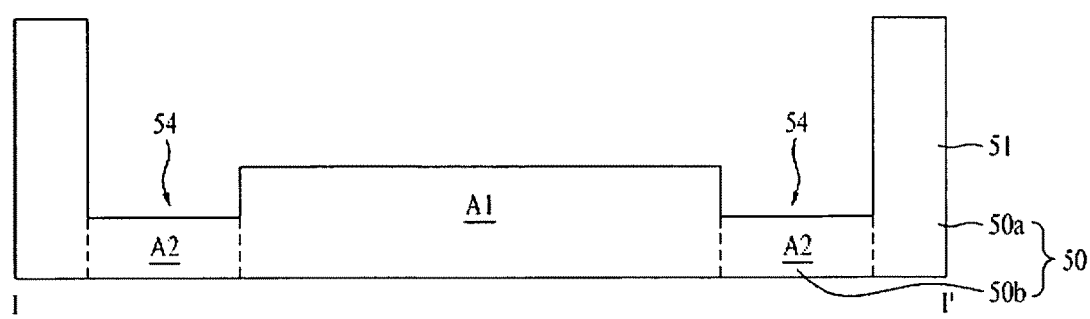

Then, referring to FIG. 4c, a glass cap 52 is formed having a horizontal portion 50b divided into a first region A1 and a second region A2, and recesses 54 on an outside of the first region A1 by using photolithography and etching with a mask. Various kinds of methods of photolithography and etching may be used in formation of the glass cap 52 shown in FIG. 4c.

Two kinds of the methods will be described, taking examples.

The first method is a method in which the glass cap 52 is formed by two times of mask steps, i.e., the glass sheet 51 is subjected to patterning by using photolithography and etching with a first mask to form up to a vertical portion 50a and the horizontal portion 50b only having the first region A1 of the glass cap 52. Then, the outside region of the horizontal portion 50b is subjected to patterning by using photolithography and etching with a second mask to form the second region A2 on an outside of the first region A1 having a thickness thinner than the first region A1 and rectangular recesses 54 formed owing to a difference of thicknesses between the first region A1 and the second region A2.

According to this, the horizontal portion 50b having the first region A1, the second region A2 having a thickness thinner than the first region A1, and the rectangular recesses 54 is finished.

Though a method is introduced, in which the first region A1 is formed in a first mask step, and the second region A2 is formed in the second mask step, the method is not limited to this, but the second region A2 may formed in the first mask step, and the first region A1 may formed in the second mask step.

Figure 5A:
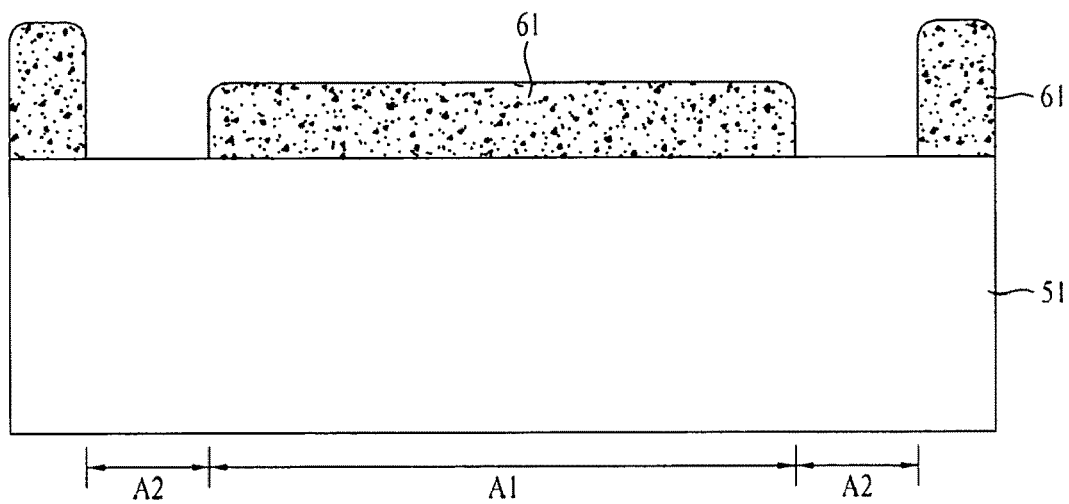
FIGS. 5a and 5b illustrate sections showing the step of FIG. 4c in detail.

The second method is formation of the first region A1, the second region A2 having a thickness thinner than the first region A1, and the recesses 54 by one time of photolithography with a half-tone mask. The method will be described with reference to FIGS. 5a and 5b. As shown in FIG. 5a, the glass sheet 51 is subjected to exposure and development with the half-tone mask to form a photoresist pattern 60 which exposes a region for the second region A2 or regions of the recesses 54 and has a relatively high height at a region for the vertical portion 50a and a relatively low height at a region for the first region A1.

Figure 5B:
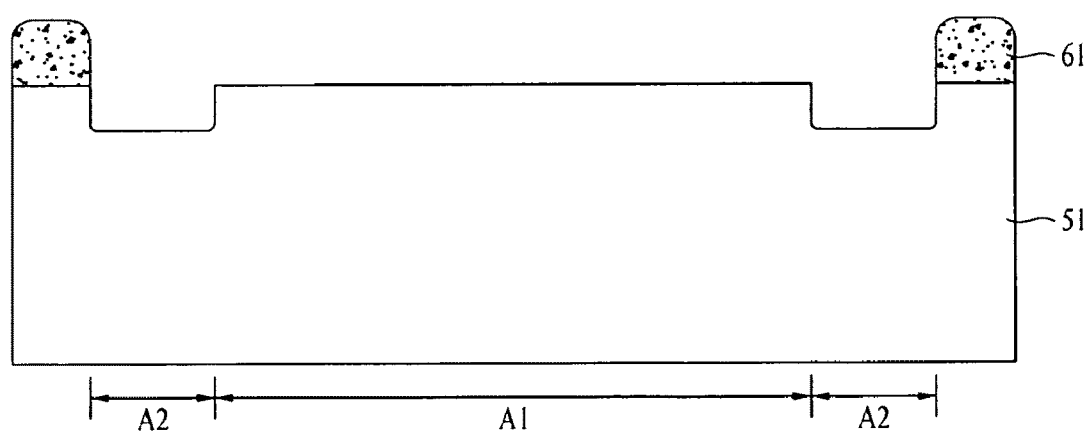

Then, Etching is performed to remove a portion from a region at which the second region A2 or the recesses 54 to be formed in the glass sheet 51. Then, as shown in FIG. 5b, ashing is performed, to remove the photoresist pattern 61 from the first region A1, i.e., a region which does not overlap with regions at which the recesses 54 are to be formed respectively, and to leave the photoresist pattern only at a region where the vertical region 50a is to be formed. Then, as shown in FIG. 4c, etching is performed again, to form the glass cap 50 having the vertical portion 50a, and the horizontal portion 50b with the first region A1, the second region A2, and the recesses 54.

Figure 4D:
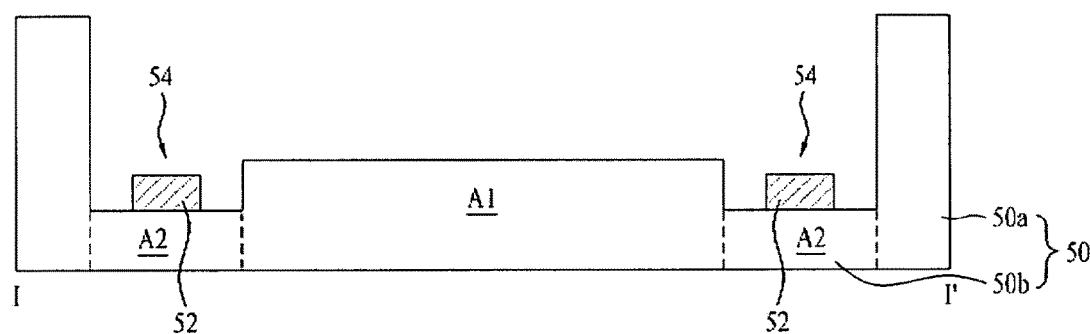

Then, referring to FIG. 4d, moisture absorbent 52 is attached only on bottoms of the rectangular recesses 54, which overlap with the second region A2. The moisture absorbent 52 has a height of a step d1 between the first region A1 and the second region A2, i.e., a thickness difference between the first region A1 and the second region A2, or a thickness thinner than a depth of the recess 54.

Then, encapsulation is performed for protection of the organic EL array unit 20 from an external environment, to bond the substrate 2 having the organic EL array unit 20 formed thereon and the glass cap 50 with sealant. In this instance, an environment in which the encapsulation is performed has a pressure set higher than the atmospheric pressure for making an inside pressure of the organic EL display device encapsulated with the glass cap 50 to be higher than the atmospheric pressure after the encapsulation. The related art encapsulation is performed at a pressure lower than the atmospheric pressure, resulting in sagging down of the horizontal plane of the glass cap 50 toward the organic EL array unit due to a low pressure in the organic EL display device as the time passes by after finishing the encapsulation, which makes the scratches by the moisture absorbent more intensive.

However, since the environment of the present invention in which the encapsulation is performed has a pressure set higher than the atmospheric pressure, the inside pressure of the organic EL display device is higher than the atmospheric pressure after finishing the encapsulation. As a result of this, the sagging down of the horizontal portion 50b of the glass cap 50 toward the organic EL array unit can be prevented.

Upon finishing the encapsulation, the organic EL display device as shown in FIG. 1 can be completed.

Thus, in the organic EL display device and the method for fabricating the same in accordance with the first preferred embodiment of the present invention, the horizontal portion 50b of the glass cap 50 is formed to have the first region A1 thicker than other regions, and the rectangular second regions A2 on an outside of the first region A1 having a thickness thinner than the first region A1. The moisture absorbent 52 is attached only in the recesses 54 to prevent the moisture absorbent 52 from being brought into contact with the organic EL cell even if the glass cap 50 sags or pressed down by an external pressure. As a result of this, defective image, such as dark spot, caused by scratch can be prevented, to improve reliability of the organic EL display device.

Moreover, as the encapsulation is performed in an environment with a pressure higher than the atmospheric pressure, the sagging of the horizontal portion 50b of the glass cap 50 toward the organic EL array unit 20 can be prevented.

Figure 6:
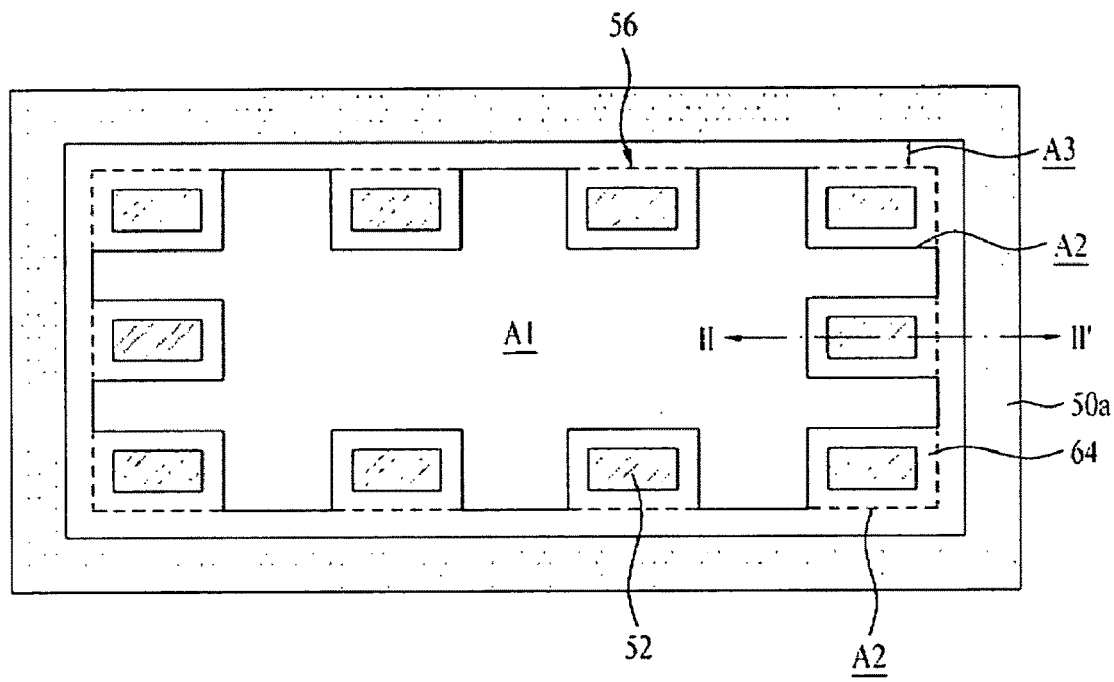
FIG. 6 illustrates a plan view of an inside structure of a glass cap in accordance with a second preferred embodiment of the present invention.
Figure 7:
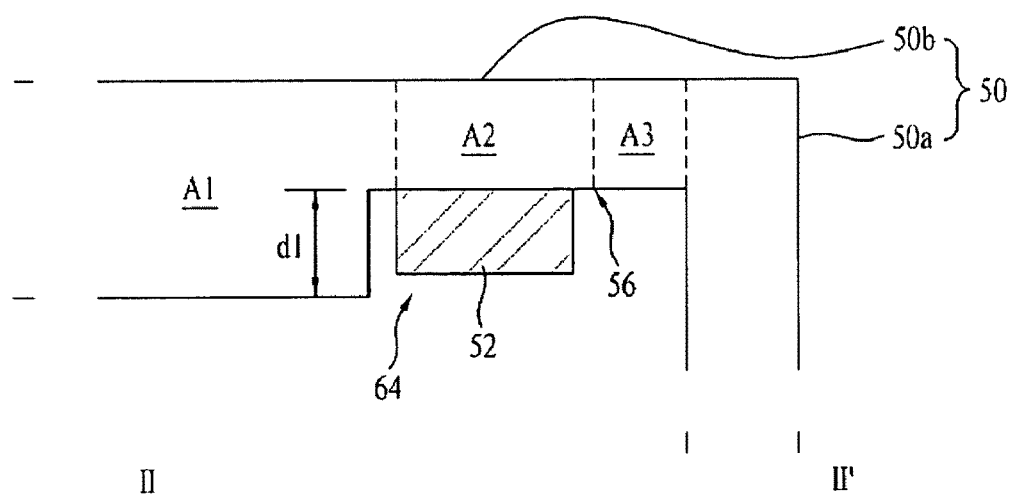
FIG. 7 illustrates a section across a line I-I' in FIG. 6.

FIG. 6 illustrates a back side plan view of an inside structure of a glass cap 50 in accordance with a second preferred embodiment of the present invention, and FIG. 7 illustrates a section across a line I-I' in FIG. 6.

Referring to FIGS. 6 and 7, the horizontal portion 50b of the glass cap 50 includes, not only the first region A1 which is a central region of the horizontal portion 50b having a thickness thicker than other regions, second regions A2 on an outside of the first region A1 each having a thickness thinner than the first region A1, and rectangular recesses 64 defined by the first region A1 and the second region A2, but also a third region which is a space between the vertical portions 50a and the second region A2. In addition to this, the horizontal portion 50b includes a passage between the vertical portion 50a and the recess 64 extended from the rectangular recesses 64 toward the vertical portion 50a and overlapped with the third region A3.

Since the glass cap 50 of the second embodiment is identical to the glass cap 50 of the first embodiment except above, detailed description of identical parts will be omitted.

Referring to FIGS. 6 and 7, the third region A3 surrounds the first and second regions A1 and A2 and positioned at a plane the same with the second region A2. Since the passage 56 surrounds, and is connected to, the recesses 64, the passage 56 serves the recesses 64, not isolated from, but connected to, one another. As a result of this, even if oxygen and moisture are concentrated on any one side, the passage 56 permits the oxygen and moisture to be absorbed to the moisture absorbent uniformly.

The glass cap 50 in FIGS. 6 and 7 can be formed by the method identical to the method shown in FIGS. 4a to 5b. By photolithography and etching with a mask, the second region A2 and the third region A3 can be formed at a time, to form the recesses 43 and the passage 56 as well. Other steps are identical to the first embodiment shown FIGS. 4a to 5b.

As has been described, in the organic EL display device and the method for fabricating the same of the present invention, the attachment of the moisture absorbent 52 only to an inside of the recesses 54 permits to prevent the moisture absorbent 52 from being brought into contact with the organic EL cell even if the glass cap 50 sags or pressed down by an external pressure. As a result of this, defective image, such as dark spot, caused by scratch can be prevented, to improve reliability of the organic EL display device. The attachment of the moisture absorbent to the outermost region permits to save a material cost.

Figure 8:
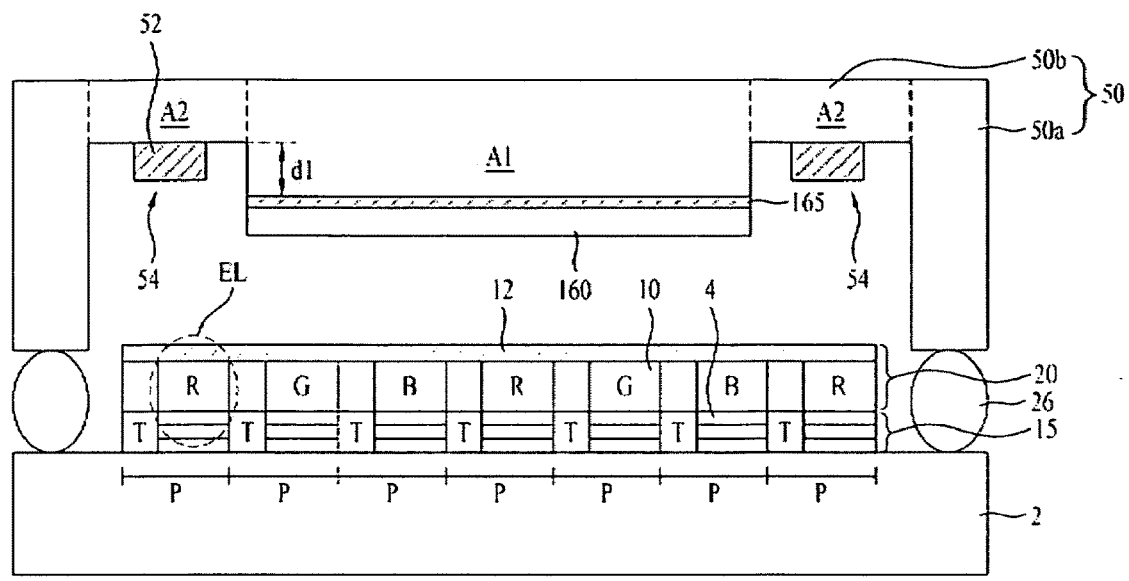
FIG. 8 illustrates a section of an organic EL display device in accordance with a third preferred embodiment of the present invention.

FIG. 8 illustrates a section of an organic EL display device in accordance with a third preferred embodiment of the present invention.

Referring to FIG. 8, the organic EL display device includes a glass cap 50 identical to the glass cap shown in FIG. 1 or 3. That is, the glass cap 50 includes a vertical portion 50a on sides of the organic EL array unit 20, and a horizontal portion 50b covered on the organic EL array portion 20, horizontally. The horizontal portion 50b includes a first region A1 which is a central region of the horizontal portion 50b, and a second region A2 on an outer side of the first region A1 having rectangular recesses 54 in a surface facing the organic EL array unit 20. The vertical portion 50a is bonded to the lower substrate 2 with sealant 26.

The first region A1 has a thickness relatively thicker than the second region A2, and the second region A2 has recesses 54 each having a step greater than at least a thickness of the moisture absorbent 52 compared to the first region A1. That is, by providing the recesses 54, the moisture absorbent 52 at the second region A2 are not brought into contact with the organic EL array unit 20 though the glass cap 50 covers the organic EL array unit 20. The step from the recess 54 relative to the first region A1 is about 100~200 µm, and the first region A1 has a thickness of 500~1000 µm.

The glass cap 50 having the horizontal portion 50b with the first and second regions A1 and A2 and the vertical portion 50a may be formed by the photolithography and etching described before, or by sanding or molding. That is, the glass cap 50 may be formed by etching or grinding the recesses 54 at the second region A2.

Since the moisture absorbent 52 is surrounded by the recess 54 defined by the second region A2, the moisture absorbent 52 can not be brought into contact with the organic EL array unit 20 even if the glass cap 50 sags down or pressed down by an external pressure. As a result of this, formation of a defective image, such as dark spots, caused by scratches is prevented, thereby improving reliability of the organic EL display device. In this case, the moisture absorbent 52 may be calcium oxide CaO.

Together with this, a plastic film 160 is attached to the first region A1 with a two-sided tape 165 disposed therebetween additionally, so that the plastic film 60 which is relatively softer than the glass of the glass cap 50 is actually brought into contact with the organic EL array unit 20 for minimizing damage of a contact portion of the organic EL array unit 20 when the first region A1 is brought into contact with the organic EL array unit 20.

The plastic film 160 may be formed of one selected from PET (Polyethylene Terephthalate), PEN (Polyethylene Naphthalate), PC (Polycarbonate), PES (Polyethersulfone), PAR (Polyarylate), PCO (Photocatalytic oxidation) and PI (Polyamide). Besides above materials, the plastic film 160 may be formed of one selected from materials having low out-gassing by heat and resistant to an external physical impact.

It is preferable that the plastic film 160 has a minimum roughness and no adherence for itself, and is required to prevent the plastic film 160 from being damaged when the plastic film 160 is brought into contact with the organic EL array unit 20. The plastic film 160 can be attached to the first region A1 with the two-sided tape 165 having adherence to two sides.

It is required that the plastic film 160 is applied to the first region A1 such that possible burrs at edges of the plastic film 160 are directed upward on the drawing, for preventing damage to the organic EL array unit 20 caused by the burrs.

What is brought into contact with the organic EL array unit 20 actually is the plastic film 60 applied to the first region A1 of the horizontal portion 50b in surface to surface contact, and, in order to prevent the organic EL array unit 20 from being damaged additionally, an organic or inorganic film may be applied to an upper side of the organic EL array unit 20, additionally.

In this case, the two-sided tape 165 and the plastic film 160 may be applied in a film attachment step.

Figure 9:
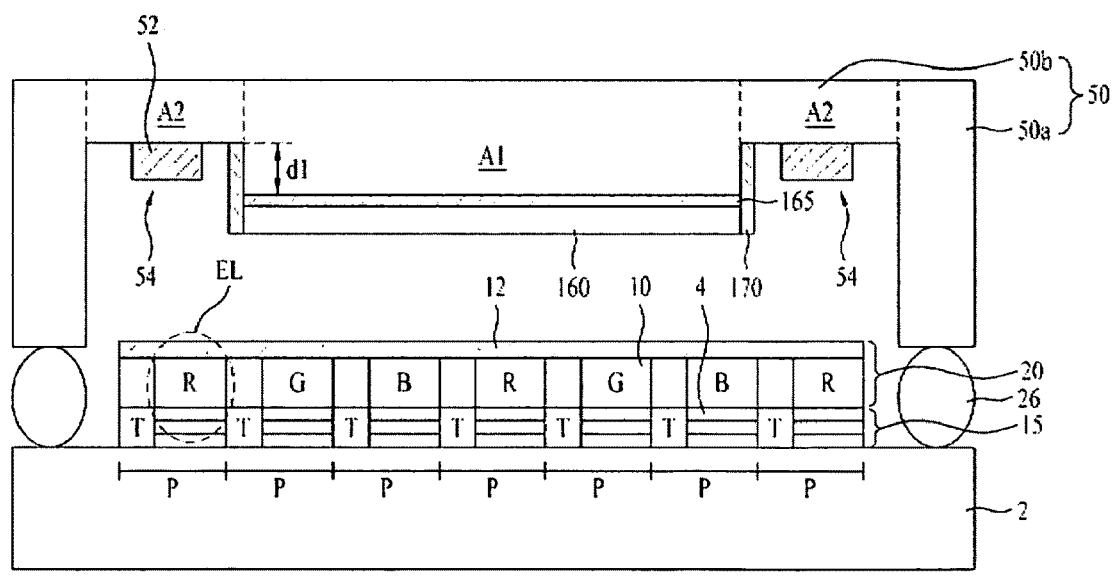
FIG. 9 illustrates a section of an organic EL display device in accordance with a fourth preferred embodiment of the present invention.

FIG. 9 illustrates a section of an organic EL display device in accordance with a fourth preferred embodiment of the present invention.

Referring to FIG. 9, the organic EL display device includes a relatively thicker first region A1 and additional metal wirings 170 at sides of the plastic film 160 in comparison to the organic EL display device in accordance with the third preferred embodiment of the present invention.

The metal wiring 170 is formed of a metal, such as silver, gold, copper and aluminum for shielding static electricity from the plastic film 160.

The metal wiring may be formed by sputtering, or pasting.

Figure 10:
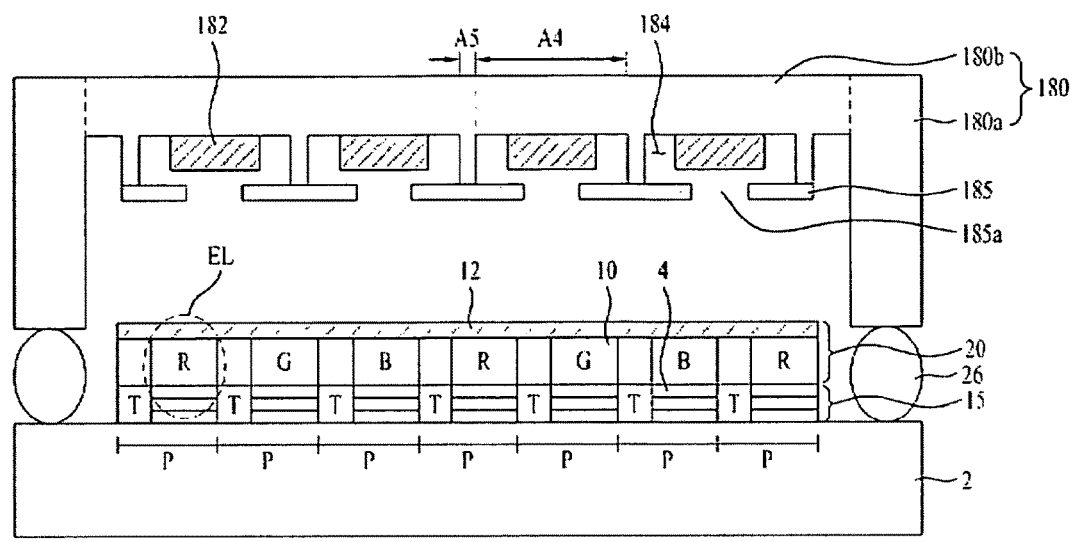
FIG. 10 illustrates a section of an organic EL display device in accordance with a fifth preferred embodiment of the present invention.
Figure 11:
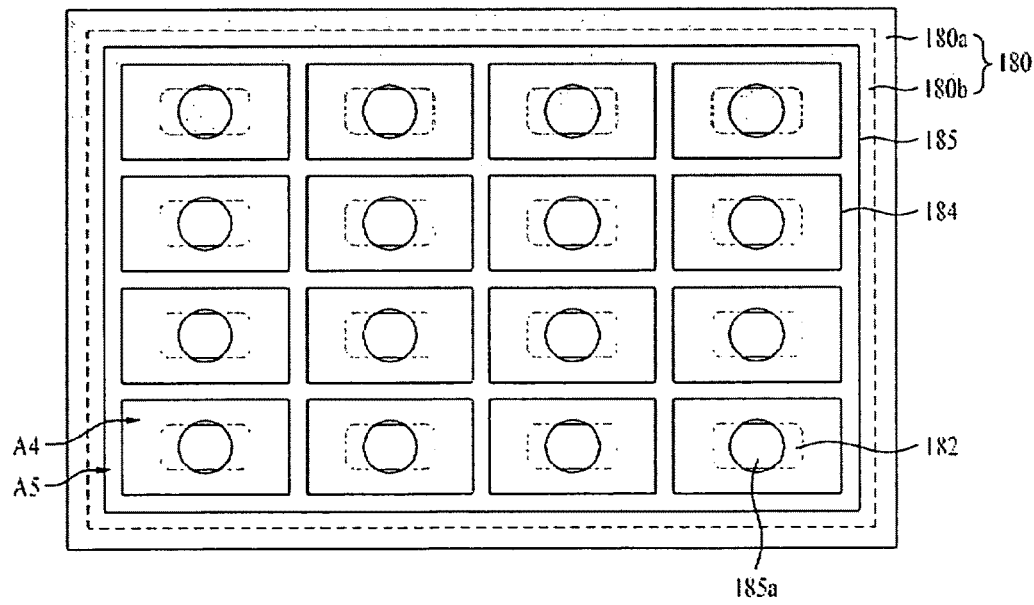
FIG. 11 illustrates a plan view of an organic EL display device in accordance with the fifth preferred embodiment of the present invention in FIG. 10.

FIG. 10 illustrates a section of an organic EL display device in accordance with a fifth preferred embodiment of the present invention, and FIG. 11 illustrates a plan view of an organic EL display device in accordance with the fifth preferred embodiment of the present invention in FIG. 10.

Referring to FIGS. 10 and 11, the organic EL display device shows an example having moisture absorbent 182 formed throughout entire region of the horizontal portion 50b.

The organic EL display device includes a glass cap 180 having a vertical portion 180a opposite to upper edges of the lower substrate 2, and a horizontal portion 180b having a fixed thickness horizontally connected to the vertical portion 180a to face the organic EL array unit 20. The horizontal portion 180b includes a first region A4 having relatively thinner recesses 184, and a second region A5 which defines regions between the recesses 184 in a form of grating. The horizontal portion 180b and the vertical portion 180a are formed of unitary glass. For defining the recesses 184 in the horizontal portion 180b, the photolithography and etching shown in FIGS. 5a and 5b or the sanding or the molding is used.

The steps of a method for fabricating a glass cap of the organic EL display device in accordance with the fifth preferred embodiment of the present invention will be described.

Figure 12A:
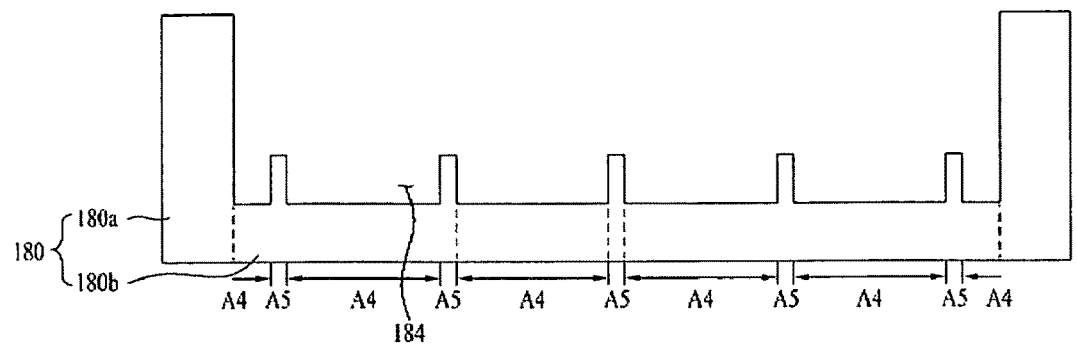
FIGS. 12a to 12c illustrate sections showing the steps of a method for fabricating a glass cap of the organic EL display device in accordance with the fifth preferred embodiment of the present invention.
Figure 12B:
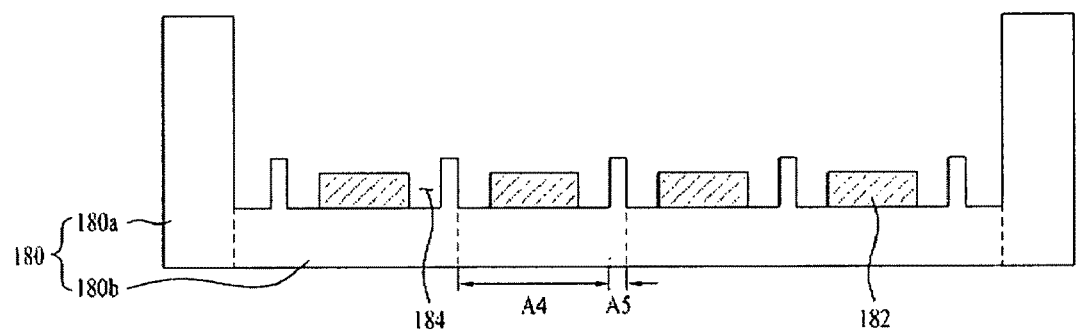
Figure 12C:
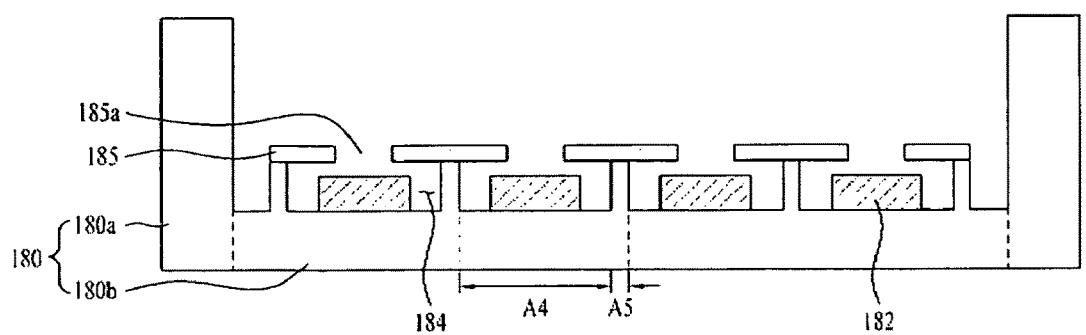
Figure 13A:
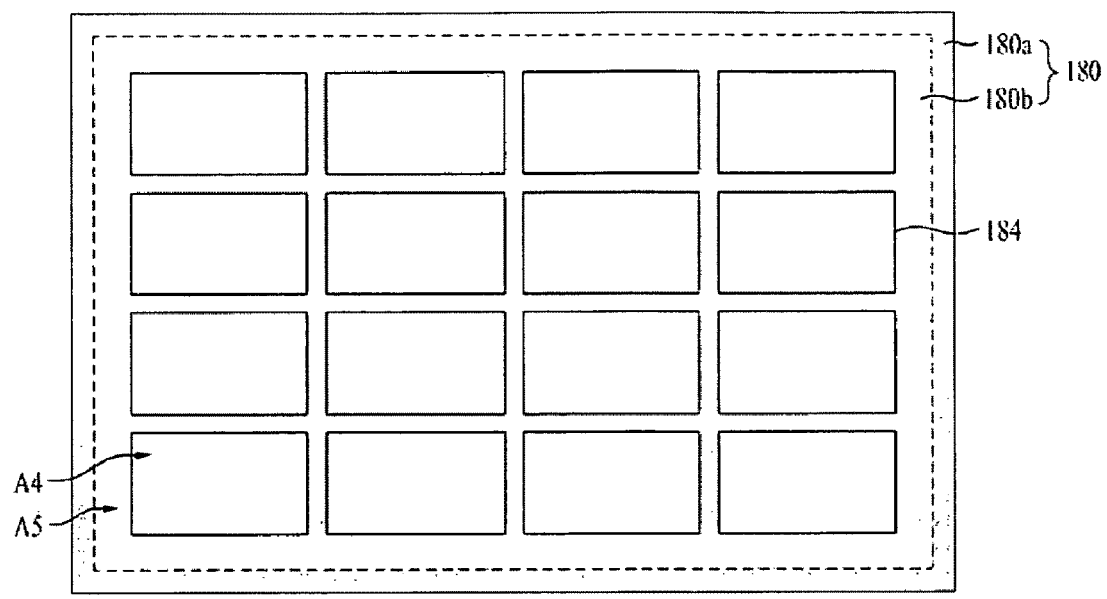
FIGS. 13a to 13c illustrate plan views showing the steps of a method for fabricating a glass cap of the organic EL display device in accordance with the fifth preferred embodiment of the present invention.
Figure 13B:
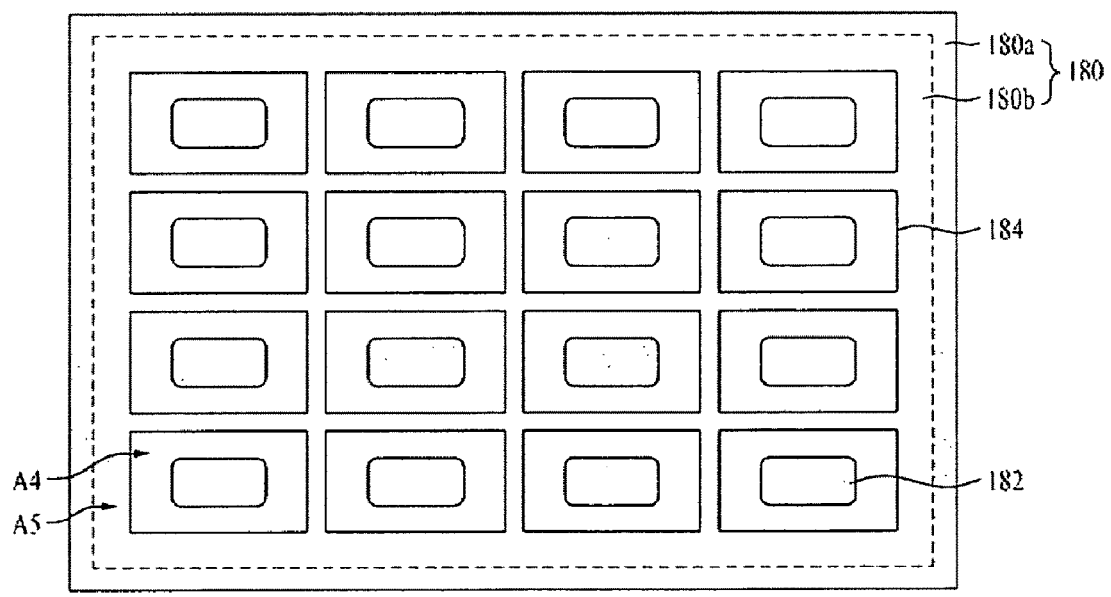
Figure 13C:
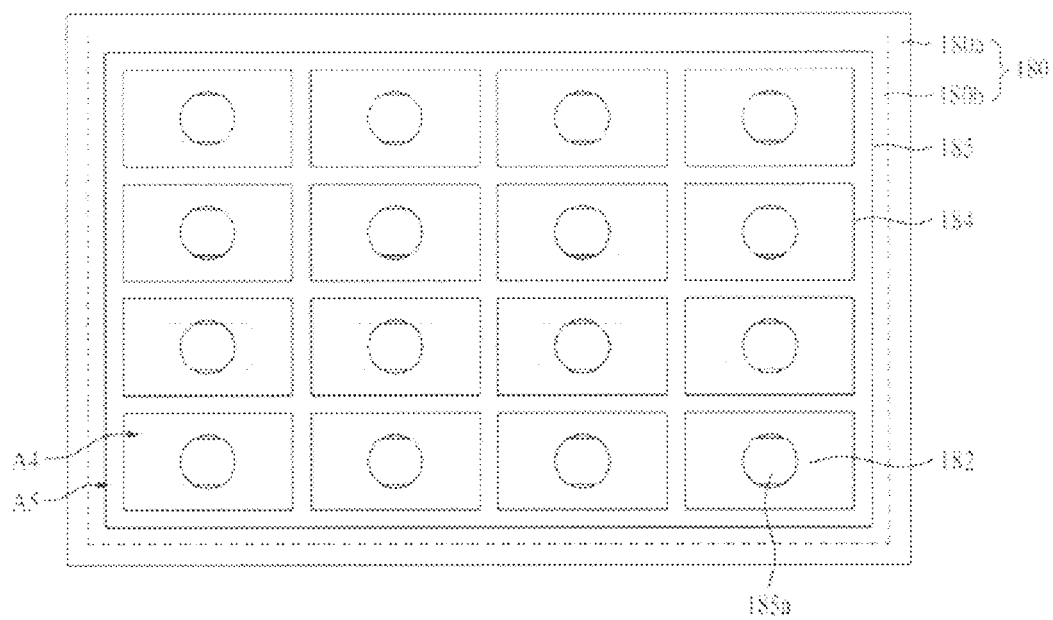

FIGS. 12a to 12c illustrate sections showing the steps of a method for fabricating a glass cap of the organic EL display device in accordance with the fifth preferred embodiment of the present invention, and FIGS. 13a to 13c illustrate plan views showing the steps of a method for fabricating a glass cap of the organic EL display device in accordance with the fifth preferred embodiment of the present invention.

Referring to FIGS. 12a and 13a, a glass cap 180 having a plurality of recesses 184 formed spaced from one another is provided. As described before, the glass cap 180 includes a horizontal portion having a relatively thinner first region A4 and a relatively thicker second region A5, and a vertical portion connected to edges thereof, vertically. A step between the first region A4 and the second region A5, i.e., a thickness of the recess 184 is about 100~200 μm which is thicker than a thickness of the moisture absorbent to be formed in succession.

Referring to FIGS. 12b and 13b, the moisture absorbent 182 is formed with in each of the recesses 184 in the horizontal portion 180b. The moisture absorbent are isolated by the second region A5 having a grating form.

Referring to FIGS. 12c and 13c, after applying two-sided tape (not shown) to the second region A5, a plastic film 180 having holes 185a which expose upper sides of the moisture absorbent 182 is applied to the horizontal portion 180b having the first region A4 with the moisture absorbent formed thereon and the second region A5.

The plastic film 185 is formed of a material identical to the plastic film described in the third embodiment.

The glass cap 180 of the embodiment has more recesses formed in the central portion of the horizontal portion 180b.

As shown, the holes 185a may be circular, or polygonal. A shape of the hole 185a is determined in a range that is not impair a function of the moisture absorbent, with a size of 0.1~5 mm in diameter. As shown, the holes 185a may, or may not be formed throughout an entire region.

Figure 14A:
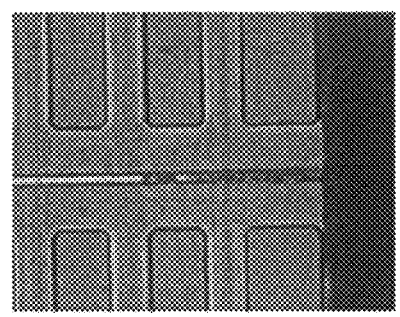
FIGS. 14a and 14b illustrates enlarged photographs of pixels showing defect improvement from a defect in a related art structure to a defect of a structure of the present invention.
Figure 14B:
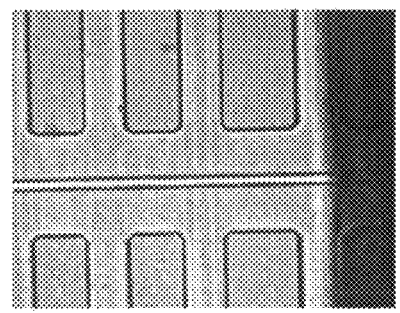

FIGS. 14a and 14b illustrates enlarged photographs of pixels showing defect improvement from a defect in a related art structure to a defect of a structure of the present invention.

Referring to FIG. 14a, a related art structure shows damage to the pixel taken place when the moisture absorbent of other components is brought into contact with the organic EL array unit, which is visible to a user, making sense of vision poor.

FIG. 14b illustrates an enlarged pixel in accordance with the third preferred embodiment of the present invention, showing no defect of the pixels. From this, it can be known that the defect is improved, which is caused by damage coming form the contact between components of the glass cap and the lower organic EL array unit of the related art.

As has been described, the organic electro-luminescence display device and a method for fabricating the same of the present invention have the following advantages.

The provision of the moisture absorbent only within recesses on an outside periphery of the glass cap permits to prevent the moisture absorbent from being brought into contact with the organic EL cells even if the moisture absorbent sags or pressed down by an external pressure. As a result of this, formation of a defective image caused by dark spots coming from scratches can be prevented, thereby improving reliability of the organic EL display device. Since the moisture absorbent is placed on the outside periphery, a material cost can be saved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electro-luminescence EL display device comprising:
   a thin film transistor array unit formed on a lower substrate;
   an organic EL array unit on the thin film transistor array unit having a matrix of organic EL cells;
   a glass cap bonded to the lower substrate with sealant at edges of the lower substrate for protecting the organic EL array unit, wherein the glass cap comprises:
      a vertical portion bonded to the lower substrate with the sealant;

a horizontal portion connected to the vertical portion to face the organic EL array unit including a first region, and a second region having recesses each with a thickness thinner than the first region, wherein the first region has a difference of thickness from the second region that is greater than a thickness of a moisture absorbent;

moisture absorbent within each of the recesses;

a plastic film disposed between the organic EL array unit and the glass cap and attached to the first region of the glass cap, wherein the plastic film is spaced from the organic EL array unit; and a metal wiring formed on a sidewall of the plastic film, wherein the glass cap, the lower substrate and the sealant define a sealed environment of which a pressure is higher than an atmospheric pressure.

2. The device as claimed in claim 1, wherein each of the recesses is a rectangularly flat recess.

3. The organic electro-luminescence EL display device according to claim 1, wherein the first region is facing the organic EL organic EL array and the second region is outside of the first region.

4. The organic electro-luminescence EL display device according to claim 3, further comprising a third region between the second region and the vertical portion, the third region having a passage connected to the recesses.

5. The device as claimed in claim 1, wherein the recesses are formed in a surface facing the organic EL array unit adjacent to the edges of the horizontal portion.

6. The device as claimed in claim 1, wherein the plastic film is applied to the first region with a two-sided tape disposed therebetween.

7. The device as claimed in claim 1, wherein the plastic film is formed of one selected from PET (Polyethylene Terephthalate), PEN (Polyethylene Naphthalate), PC (Polycarbonate), PES (Polyethersulfone), PAR (Polyarylate), PCO (Photocatalytic oxidation) and PI (Polyamide).

8. An organic electro-luminescence EL display device comprising:

a thin film transistor array unit formed on a lower substrate;

an organic EL array unit on the thin film transistor array unit having a matrix of organic EL cells;

a glass cap bonded to the lower substrate with sealant at edges of the lower substrate for protecting the organic EL array unit, wherein the glass cap comprises:

a vertical portion bonded to the lower substrate with the sealant;

a horizontal portion connected to the vertical portion to face the organic EL array unit including a first region, and a second region having recesses each with a thickness thinner than the first region, wherein the first region is formed in a planar grating shape on the horizontal portion, wherein the first region has a difference of thickness from the second region that is greater than a thickness of a moisture absorbent;

moisture absorbent within each of the recesses; and a plastic film disposed between the organic EL array unit and the glass cap and attached to the first region of the glass cap, wherein the plastic film is spaced from the organic EL array unit, wherein the glass cap, the lower substrate and the sealant define a sealed environment of which a pressure is higher than an atmospheric pressure.

9. The device as claimed in claim 8, wherein the plastic film has through holes communicating with the moisture absorbent.

10. The device as claimed in claim 8, wherein the plastic film is applied to the first region with a two-sided tape disposed therebetween.

11. The device as claimed in claim 8, wherein the plastic film is formed of one selected from PET (Polyethylene Terephthalate), PEN (Polyethylene Naphthalate), PC (Polycarbonate), PES (Polyethersulfone), PAR (Polyarylate), PCO (Photocatalytic oxidation) and PI (Polyamide).

* * * * *